United States Patent
Jardin-Lemagnen et al.

(10) Patent No.: US 7,126,364 B2
(45) Date of Patent: Oct. 24, 2006

(54) INTERFACE COMPRISING A THIN PCB WITH PROTRUSIONS FOR TESTING AN INTEGRATED CIRCUIT

(75) Inventors: Frédéric Jardin-Lemagnen, Caen (FR); Emmanuel Savin, Soulangy (FR); Sébastien Leruez, Caen (FR)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/527,108
(22) PCT Filed: Sep. 4, 2003
(86) PCT No.: PCT/IB03/03899
§ 371 (c)(1), (2), (4) Date: Mar. 8, 2005
(87) PCT Pub. No.: WO2004/025309
PCT Pub. Date: Mar. 25, 2004

(65) Prior Publication Data
US 2006/0033511 A1 Feb. 16, 2006

(30) Foreign Application Priority Data
Sep. 11, 2002 (FR) .................................. 02 11243

(51) Int. Cl.
*G01R 31/02* (2006.01)
(52) U.S. Cl. ..................................... 324/761
(58) Field of Classification Search ................ 324/754, 324/761, 762, 765, 760, 158.1; 439/66; 257/48
See application file for complete search history.

(56) References Cited

U.S. PATENT DOCUMENTS

| 5,529,504 A | 6/1996 | Greenstein et al. |
| 5,828,226 A * | 10/1998 | Higgins et al. .............. 324/762 |
| 5,966,022 A * | 10/1999 | Budnaitis et al. ........... 324/760 |
| 6,029,344 A | 2/2000 | Khandros et al. |
| 6,676,438 B1 * | 1/2004 | Zhou et al. ................. 439/482 |
| 6,981,880 B1 * | 1/2006 | Brodsky et al. .............. 439/66 |
| 2002/0039847 A1 | 4/2002 | Clayton |

* cited by examiner

*Primary Examiner*—Ha Tran Nguyen
*Assistant Examiner*—Tung X. Nguyen

(57) ABSTRACT

The invention relates to a test device for testing an integrated circuit called test circuit, comprising a plurality of housings intended to be tested in a printed circuit called main circuit. The device comprises an insulating membrane of soft material having two opposite surfaces covered by two conductive layers interconnected by via holes and intended to be in contact with the test circuit and the main circuit respectively, under the influence of a pressure exerted during the test between the test circuit and the main circuit pressing the test device. Protrusions are arranged on at least one of the two layers in a predefined pattern as a function of said pins, tabs, pads etc. of the test circuit so as to ensure a contact quality between said layer and the circuit (to be tested or the main circuit) having contact with said layer under the influence of said pressing action.

18 Claims, 2 Drawing Sheets

Figure 1:
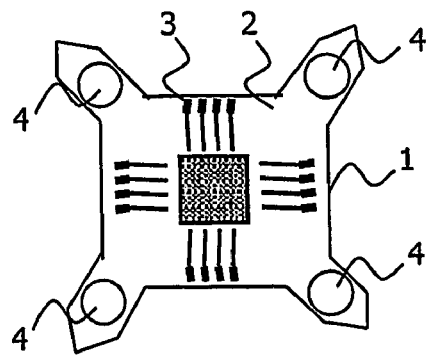

INTERFACE COMPRISING A THIN PCB WITH PROTRUSIONS FOR TESTING AN INTEGRATED CIRCUIT

RELATED APPLICATION DATA

The present application is a 371 of PCT/IB03/03899 filed on Sep. 4, 2003.

The invention relates to the domain of integrated circuits. More particularly the invention relates to a test device and a test method for testing an integrated circuit called test circuit, intended to be tested in a printed circuit called main circuit.

The invention has for an object to ensure the contact between the test board (printed circuit) and the component to be tested as such. Moreover, the invention permits to test various types of casings (encapsulating the same integrated circuit or of the same family) with the aid of the same test board or laboratory model called main printed circuit (the latter initially being designed for one type of casing).

The invention is applied to all types of integrated circuit tests, notably the test during production (bulk), the laboratory test or also the reliability/quality test called burn-in.

The invention is particularly advantageous for the test of integrated circuits operating at high frequencies of the order of 2 GHz, for example, notably of the type of power amplifiers for cell phones, radio frequency circuits for cell phones, circuits for video application (TV and satellite decoder) as well as all the integrated circuits conveying high frequency/radio frequency (HF/RF) signals.

There are numerous types of test devices often called test sockets of the type mentioned in the opening paragraph, which are used during production to protect the main test circuit or board and avoid its premature wear during the repeated passing of elements to be tested. These devices or test sockets have a certain thickness and a certain contact length (micropoint contact or pogos, Johnstech contact in the form of an S, elastomer contact etc.) which render the test of circuits operating at high frequency difficult or even impossible. Moreover, they are often very expensive. Actually, high-frequency circuits like, for example, power amplifiers generally do not tolerate any additional contact length because they are very sensitive to the inductance caused by the test device itself.

Types of integrated circuits are generally tested with the technique called True Plunge To Board (TPTB) according to which the test circuit is directly inserted into the test board (main circuit), without any additional device. In the particular case of casings of the HVQFN (Heatsink Very thin Quad Flat Package No leads) which are housings without pins or lugs, but having only flat contact areas called "pads", this TPTB technique requires considerable support force of the order of a minimum of 120 Newton to obtain sufficient electrical contact. After a certain number of pieces that have passed on the same TPTB test board, for example, of the order of 200,000 pieces, or a week's production for a bulk circuit, the board is used until it becomes unusable because the place of contact with the test circuit is completely destroyed by the passing of the pieces. It is then necessary to manufacture a new test board, which takes a long time to perfect and is costly.

It is an object of the invention to remedy this disadvantage.

This object is achieved with a test device comprising an insulating membrane of elastic material having two opposite surfaces covered by two layers of conductive tracks interconnected by connection means, in which protrusions are arranged on at least one of said layers in a predefined pattern as a function of the position of the contacts (pins, pads, balls etc.) of the integrated circuit to be tested, so as to ensure a contact quality between said layer and the circuit (the test circuit or the main circuit) in contact with said layer.

The elasticity or softness of the membrane permits to obtain good contact by absorbing differences in flatness between the test circuit and the main circuit, the performance of the device being all the more interesting as the membrane is thin. The protrusions permit to improve the connection quality by increasing the degree of friction between the parts to be contacted. The two interconnected conductive layers on either side of the membrane form a system which permits to reduce the length of the contacts of the device.

The invention also proposes a test method comprising installing an integrated circuit in a given housing of a set of housings of different types (for example, of the types HVQFN, HVSON, Heatsink Very thin Small Outline package No leads, LQFP Low Quad Flat Package with 32 or 64 pins, etc.), the integrated circuit being intended to be tested successively in various types of housings of said set with the aid of a single test board or main circuit, and the installment of a set of associated test devices or test sockets adapted to the various types of housings to be tested on the same test board.

Advantageously, this method permits to avoid redeveloping a new test board to sample the test circuit with each new housing, which represents substantial time saving and saving of hardware resources notably for circuits operating at high frequencies. The same test board can thus be used again with a different test device (or test socket or also thin PCB contact with protrusion) of which one surface (conductive layer) is adapted to the main circuit and the other to the type of housing considered.

These and other aspects of the invention are apparent from and will be elucidated, by way of non-limitative example, with reference to the embodiment(s) described hereinafter.

IN THE DRAWINGS

Figure 2:
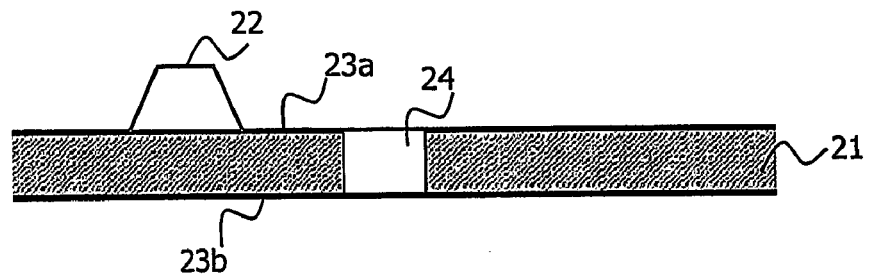
Figure 3:
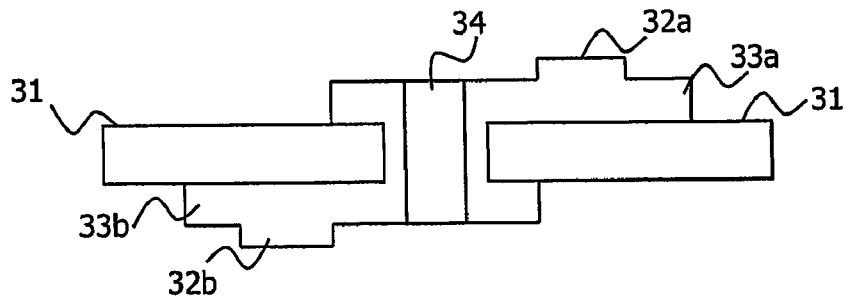
Figure 4:
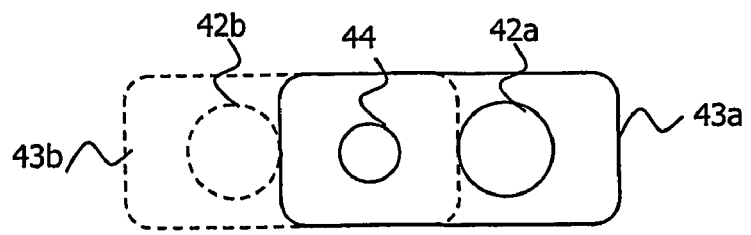
Figure 5:
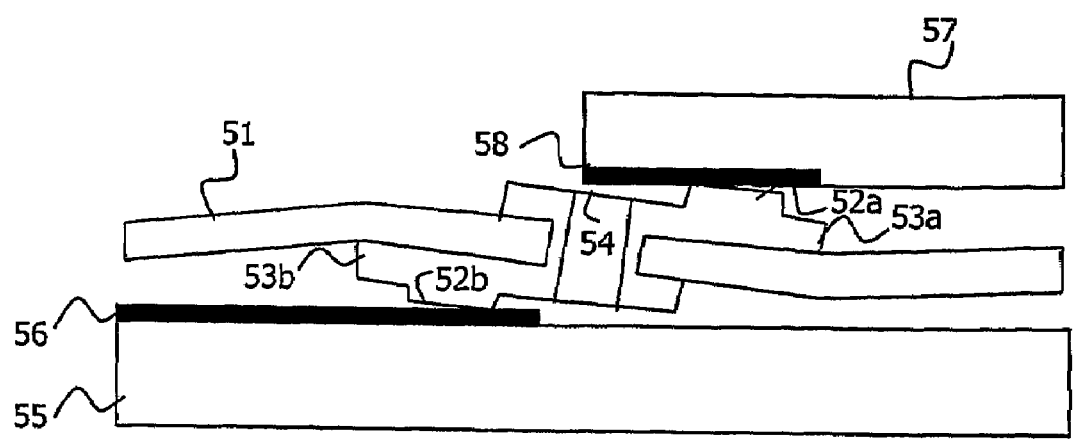
Figure 6:
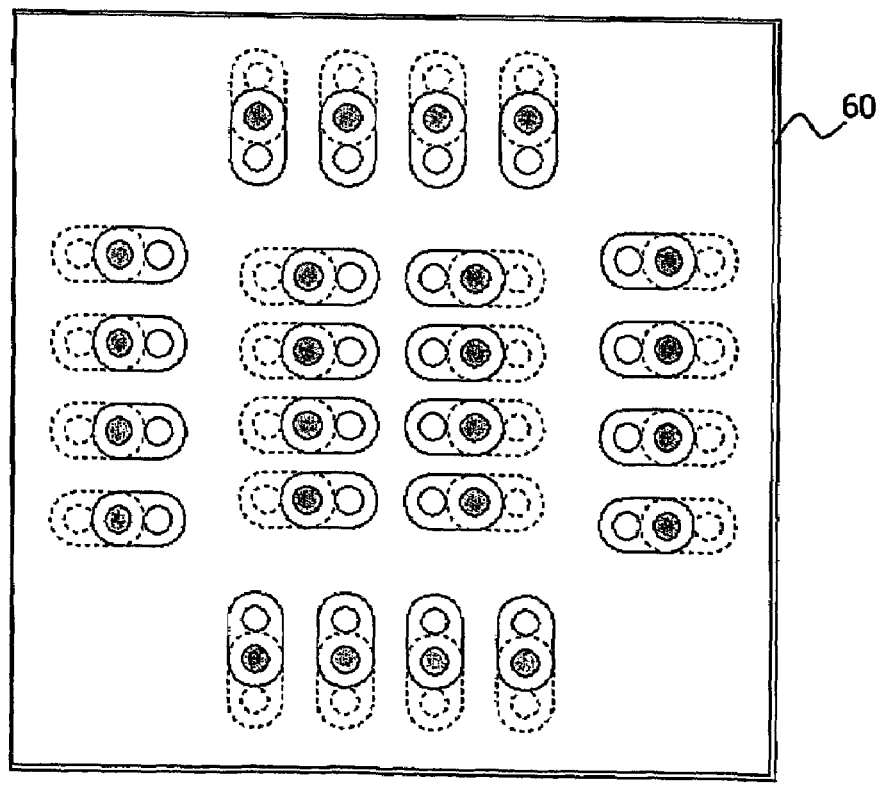

FIG. 1 is a diagrammatic representation called outline of an example of a device according to the invention, FIG. 2 is a diagrammatic representation in cross-sectional view of a detail of an example of a device according to a first embodiment of the invention, FIG. 3 is a diagrammatic representation in cross-sectional view of a detail of an example of a device according to a second embodiment of the invention, FIG. 4 is a diagrammatic representation in plan view of the detail illustrated in FIG. 3, FIG. 5 is a diagrammatic representation in cross-sectional view of the detail illustrated in FIG. 3 during a test operation, FIG. 6 is a diagrammatic representation in plan view of part of the device according to the second embodiment of the invention.

The production of low-priced integrated circuits needs to have considerable sale volumes to be profitable. The test method before delivery must be industrial and automatic to permit high rates. Integrated circuits are tested by establishing contacts with their terminals, pins, tabs, pads or balls etc., the name varying as a function of the type of housing, hereinafter generally indicated as contacts.

FIG. 1 represents a test device according to the invention to serve as an interface between an integrated circuit to be tested and a test circuit or board, also called load board, called main circuit, with the aid of which the integrated circuit is to be tested. Most of the characteristic features of the invention are not visible in FIG. 1 but are visible in the other Figures. The test circuit (not shown in FIG. 1) comprises a plurality of housings intended to be tested with the aid of the test board or main printed circuit (not shown in FIG. 1). The device comprises an insulating membrane 1 made of a material that has a certain softness and has two opposite surfaces 2 one of which is visible in FIG. 1, covered by two conductive layers 3 one layer of which corresponds to the visible surface and is visible in FIG. 1, interconnected by connection means such as, for example, vias (not shown in FIG. 1) and intended to enter into contact with the test circuit and the main circuit respectively, thanks to a deformation of the test device obtained from a pressure exerted during the test between the test circuit and the main circuit. Protrusions (not shown in FIG. 1) are arranged on at least either of the two layers in a predefined pattern as a function of the places of the contacts (pins, tabs, pads, balls etc.) of the test circuit so as to ensure a sufficient contact quality between the conductive layer supporting the protrusion and the circuit (this may either be the test circuit or the main circuit) in contact with said layer under the influence of pressure.

The test device/socket shown in FIG. 1 is a printed circuit called PCB (Printed Circuit Board), preferably thin, that is to say whose total thickness does not go beyond 400 micrometers, has protrusions serving to ensure proper contact between the test board or main circuit and the test circuit. The device plays a role of insert between the main printed circuit (industrial test board or laboratory model) and the component (test circuit) which is to be subjected to the test sequence. The component is generally enveloped in the housing to be able to manipulate it more easily without damaging the crystal that is inside. Supporting the device can be ensured by positioning studs 4. The maximum tolerable mechanical dimensions (without deformation of the support) X and Y are about 40 mm×40 mm. The outside form of the device may be arbitrary because it is to be adapted to any test circuit or board.

The example of the device illustrated in FIG. 1 is a conventional printed circuit with 2 layers, that is, one membrane preferably made of Kapton, registered trademark of Du Pont, or possibly of epoxy glass of the type FR4 which is less soft than Kapton and whose thickness does not exceed 0.1 mm, forming the support of the device put on these two opposite surfaces of two copper layers interconnected by vias. In order to have a better contact quality between the 2 printed circuits mounted on top of each other, the thin device has small protrusions in the form of truncated cones (or balls, cylinders etc.) on one surface or also on the two surfaces at will, depending on the type of housing to be tested.

FIG. 2 represents in partial cross-section the membrane 21 to show a protrusion in the form of a truncated cone 22 engraved on the conductive layer of the upper surface 22*a* connected to the conductive layer of the lower surface 23*b* by a via 24. Preferably, the height of a protrusion is to be more than 45 μm (micrometers) and its diameter which depends on the contact dimensions of the housing may be, for example, less than or equal to 125 micrometers. Protrusions may be present on the two surfaces of the membrane and may have different heights. These protrusions may be constituted by a copper layer of at least 40 mm thickness, for example, covered by a layer of nickel from 5 to 10 μm, for example, for a better resistance over time, as well as a fine layer of gold of about 0.5 μm to obtain good conductivity. The support (membrane) may be constituted by Kapton of 0.1 mm.

When a new integrated circuit appears on the market, it is accommodated in a type of housing particular for a client's application or as a function of the application for which the circuit is meant. This circuit is tested after its encapsulation in the housing thanks to test boards which are developed as a function of the chosen housing which has its own characteristics. These boards are thus specifically dedicated to a specific type of housing and the central test print is thus definitely made inflexible. When a client wishes to have the same circuits (the same crystals) mounted in different housings in view of other applications, new test boards have to be developed again in the laboratory and on the production line to sound the client out about this new housing. This operation is very costly and may take very long in time of adjustment for circuits operating at high frequencies.

In an advantageous manner, the invention permits to avoid redeveloping a test circuit for each new housing. In fact, it is sufficient to manufacture one test device that is not very costly for each contemplated type of housing. One surface of the device comprises tracks adapted to the new housing whereas the tracks of the opposite surface are adapted to the test board already developed. The test device described above thus always plays the role of a housing converter by realizing the adaptation of the test circuit to a new housing. The advantages are numerous:

reduction of the force to be exerted on the housing of several Newton to obtain a sufficient electrical contact, gain of time and money by avoiding development of new test boards, hardware stability thanks to total compatibility with the existing board (laboratory or test), time gain for the evaluation of the circuit mounted in a new housing, time gain for the choice of the best housing by permitting to evaluate various housings (with the same circuit inside) on a sole similar laboratory model, and time gain for launching a new product on the market thanks to the possibility of rapidly sounding the client out about new housings.

The invention first permits to improve the commercial relations with potential clients by their avoiding a time loss and additional development costs when they decide to change a type of housing. Therefore, the invention recommends the joint delivery of an integrated circuit in a housing given from a set of different types of housings called test circuit intended to be tested with the aid of a test board called main circuit and a set of test devices corresponding to the sets of housings, adapted to said test circuit as a function of each type of housing considered.

The following Figures illustrate a particular embodiment of the invention. In the case of high-power radio-frequency circuits (such as power amplifiers for a cell phone), the global contact system (main circuit+test device) is to show a resistance of several milliohms and an inductance that is lower than several dozen nanoHenri for the contacts (pins etc.) and lower than several hundred nanoHenri for ground. This is necessary for a correct operation at radio-frequency level. The resistive aspect is due to the quality of the contact system and the inductive aspect to the dimensions of this same system.

The embodiment illustrated in FIGS. 3 to 6 is particularly adapted to the test of the radio-frequency integrated circuit (<2.4 GHz) in a housing of the type HVQFN16 (housing of 4×4 mm, 16 pads having one central exposed die pad). This housing has metallic pads of 0.5 by 0.25 mm at the location of the connection tabs or pins. It constitutes with the printed circuit that accommodates it an extremely static system since there are at least 17 contact points to be established.

FIG. 3 represents the detail of a pattern of a test device according to the embodiment mentioned above. The soft insulating membrane 31 comprises protrusions 32a and 32b arranged in pairs on the two conductive layers. Each element of the pair is situated on an opposite layer 33a and 33b on either side of the connection means 34, so as to perform a changing of the elastic membrane 31 during the pressing action carried out during the test to keep the test circuit in contact with the test board via the test device which plays the role of interface. The softness of this membrane is used to absorb the differences of flatness between the housing and the printed circuit. The patterns play the role of switch when the housing is pressed on. Moreover, during this change, friction occurs between parts to be contacted due to the protrusions, which improves the quality of the connection.

FIG. 4 represents a partial view from above (omission of the membrane) of the detail of the pattern represented in FIG. 3. References of FIG. 3 are replaced by new references in which only the Figure of the tens has been replaced by the FIG. 4. The parts not shown corresponding to the lower surface are represented in dotted lines. The protrusions 42a and 42b appear on each conductive layer 43a and 43b respectively as well as a via 44 represented in gray in the Figure, which permits to interconnect the two layers. A pattern is then constituted by two elongated pads engraved in said opposite layers 43a and 43b respectively, shifted relative to each other and interconnected by connection means, here vias 44.

FIG. 5 shows the test printed circuit, a pattern of the test device and the test printed circuit in its housing. The pattern of the test device represented in FIG. 5 is identical with the one represented in FIG. 3 but it is represented in a switching position. The references of FIG. 3 are replaced by new references in which only the Figure of the tens has been modified, between FIG. 3 and FIG. 5, and has been replaced by the FIG. 5 for the references 51 to 54. The switching position is obtained by the pressure exerted during the test operation on the test integrated circuit. The test device is positioned between the main circuit or test board 55 covered with, on the one hand, these conductive tracks 56 and the test circuit in its housing 57 from where the contacts to be tested are accessible in the form of a conductive pad 58, on the other. The protrusions of each opposite conductive layer 52a and 52b respectively, are in contact with the corresponding conductive pads of the test circuit 58 and of the main circuit 56, respectively. The housing that has just been pressed on this pattern will deform the membrane to switch the pattern relative to the axis of the via so as to produce the contact by absorbing differerices of flatness.

FIG. 6 represents a partial plan view of a test device to illustrate a complete example of a pattern 60 of the protrusions. In solid lines are drawn the patterns engraved on the front surface of the device. The engraved patterns on the back-surface appear in dotted lines in the drawing. The openings or vias realizing the connections between the protrusions of the upper and lower surfaces of the device are shown in gray. The protrusions are represented by circles as shown in FIG. 4. The patterns are formed by oblong copper pads engraved on either one of the two sides of the membrane and shifted relative to each other. These two pads are connected to each other by a via. A pillar growth of copper which gives rise to a protrusion is realized at the locations where the connection is wanted. A layer of nickel having a thickness between 5 and 10 µm covers the copper to increase the mechanical resistance. A finishing of gold on the thin (<1 µm) nickel layer improves the quality of the contact. This pattern is repeated 16 times to obtain contact with all the pins of the housing. The part called exposed die pad, situated in the center of the housing is a metallized pad of 2 mm by 2 mm which is also to be connected. This refers to radio-frequency ground. It comprises a large number of patterns to minimize the inductance of the contact at this location. This system is applicable to all the tables housings with co-planar contact pads notably of the type HVQFN and VSOFN.

The invention claimed is:

1. A test device for testing an integrated circuit comprising a plurality of contacts, called a test circuit, intended to be tested with the aid of a test printed circuit, called a main circuit, the test device comprising:
   an insulating, non-conductive membrane of a soft material having two opposite surfaces;
   two conductive layers each covering a respective one of the two opposite surfaces of said non-conductive membrane;
   connection means for interconnecting said two conductive layers, said two conductive layers being adapted to come into contact with the test circuit and the main circuit respectively, under the influence of a pressing force exerted during the test between the test circuit and the main circuit deforming the test device; and
   protrusions arranged on at least one off said two conductive layers according to a predefined pattern as a function of said plurality of contacts of the test circuit, so as to ensure a contact quality between said at least one layer and the test circuit or the main circuit in contact with said at least one layer, under the influence of said pressing force.

2. A test device as claimed in claim 1, wherein said connection means are metallized holes passing through said membrane and said two layers.

3. A test device as claimed in claim 1, wherein the test device has a thickness less than or equal to 0.4 millimeters.

4. A test device as claimed in claim 1, wherein said non-conductive membrane has a thickness less than or equal to 0.1 millimeter.

5. A test device as claimed in claim 1, wherein said protrusions have a height larger than or equal to 45 micrometers.

6. A test device as claimed in claim 1, wherein said protrusions have a diameter relative to the surface of said contacts.

7. A test device as claimed in claim 1, wherein said membrane is made of Kapton.

8. A test device as claimed in claim 1, wherein said protrusions are arranged in pairs on each of said two layers, each element of the pair being situated on an opposite layer on either side of said connection means, so as to perform a change of the soft membrane under the influence of said pressing force.

9. A test device as claimed in claim 1, wherein said protrusions are in the form of a truncated cone.

10. A test device as claimed in claim 1, wherein said protrusions are engraved onto said at least one of said two conductive layers.

11. A test device as claimed in claim 1, wherein said protrusions are arranged on both of said two conductive layers.

12. A test device as claimed in claim 11, wherein said protrusions on one of said two conductive layers are offset from said protrusions on the other one of said two conductive layers with said connection means being arranged between said protrusions.

13. A test device as claimed in claim 1, wherein said two conductive layers comprise two layers of conductive tracks.

14. A test device for testing an integrated circuit comprising a plurality of contacts, called a test circuit, intended to be tested w.ith the aid of a test printed circuit, called a main circuit, the test device comprising:
   an insulating, non-conductive membrane of a soft material having two opposite surfaces;
   two conductive layers each arranged on a respective one of the opposite surfaces of said membrane;
   a connection device which interconnects said two conductive layers, said two conductive layers being adapted to contact with the test circuit and the main circuit respectively, under the influence of a pressing force exerted during the test between the test circuit and the main circuit deforming the test device, said connection device being metallized holes passing through said membrane and through said two conductive layers; and
   protrusions arranged on at least one of said two conductive layers according to a predefined pattern as a function of said plurality of contacts of the test circuit, so as to ensure a contact quality between said at least one layer and the test circuit or the main circuit in contact with said at least one layer, under the influence of said pressing force.

15. A test device as claimed in claim 14, wherein said protrusions are arranged on both of said two conductive layers.

16. A test device as claimed in claim 15, wherein said protrusions are arranged in pairs with one of said metallized holes being situated therebetween, a first protrusion of each pair being situated on a first one of said two conductive layers on one side of a respective one of said metallized holes and a second protrusion of each pair being situated on a second one of said two conductive layers on an opposite side of said respective one of said metallized holes whereby said protrusions are thereby offset from one another.

17. A test device as claimed in claim 14, wherein said two conductive layers comprise two layers of conductive tracks.

18. A test device as claimed in claim 14, wherein said two conductive layers cover the respective one of the opposite surfaces of said membrane.

* * * * *